(12) United States Patent
Kwok et al.

(10) Patent No.: US 8,835,982 B2
(45) Date of Patent: Sep. 16, 2014

(54) METHOD OF MANUFACTURING STRAINED SOURCE/DRAIN STRUCTURES

(75) Inventors: Tsz-Mei Kwok, Hsinchu (TW); Hsueh-Chang Sung, Zhubei (TW); Kuan-Yu Chen, Taipei (TW); Hsien-Hsin Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 191 days.

(21) Appl. No.: 13/026,519

(22) Filed: Feb. 14, 2011

(65) Prior Publication Data

US 2012/0205715 A1    Aug. 16, 2012

(51) Int. Cl.
*H01L 29/72* (2006.01)

(52) U.S. Cl.
USPC ............... 257/190; 257/255; 257/E29.242; 257/E21.409

(58) Field of Classification Search
None
See application file for complete search history.

(56) References Cited

U.S. PATENT DOCUMENTS

| | | | |
|---|---|---|---|
| 6,946,350 B2 | 9/2005 | Lindert et al. | |
| 7,335,959 B2 | 2/2008 | Curello et al. | |
| 7,494,858 B2 | 2/2009 | Bohr et al. | |
| 7,989,298 B1* | 8/2011 | Chan et al. | 438/300 |
| 2007/0004123 A1* | 1/2007 | Bohr et al. | 438/230 |
| 2007/0012913 A1* | 1/2007 | Ohta et al. | 257/19 |
| 2007/0235802 A1* | 10/2007 | Chong et al. | 257/346 |
| 2008/0246057 A1* | 10/2008 | Lin et al. | 257/190 |
| 2009/0050965 A1* | 2/2009 | Okamoto | 257/350 |

FOREIGN PATENT DOCUMENTS

CN     101281926    10/2008

* cited by examiner

*Primary Examiner* — Fei Fei Yeung Lopez
(74) *Attorney, Agent, or Firm* — Lowe Hauptman & Ham, LLP (57) ABSTRACT

An integrated circuit device and method for manufacturing the integrated circuit device is disclosed. The disclosed method provides a processing for forming improved lightly doped source/drain features and source/drain features in the semiconductor device. Semiconductor device with the improved lightly doped source/drain features and source/drain features may prevent or reduce defects and achieve high strain effect. In at least one embodiment, the lightly doped source/drain features and source/drain features comprises the same semiconductor material formed by epitaxial growth.

20 Claims, 10 Drawing Sheets

METHOD OF MANUFACTURING STRAINED SOURCE/DRAIN STRUCTURES

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often includes using epitaxially grown silicon (Si) to form raised source and drain features for an n-type device, and epitaxially growing silicon germanium (SiGe) to form raised source and drain features for a p-type device. Various techniques directed at shapes, configurations, and materials of these source and drain features have been implemented for improving transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-8, a method 100 and a semiconductor device 200 are collectively described below. The semiconductor device 200 depicted in FIGS. 2-8 is an integrated circuit, or a portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that in some embodiments additional features can be added in the semiconductor device 200, and in some other embodiments some of the features described below can be replaced or eliminated.

Figure 1:
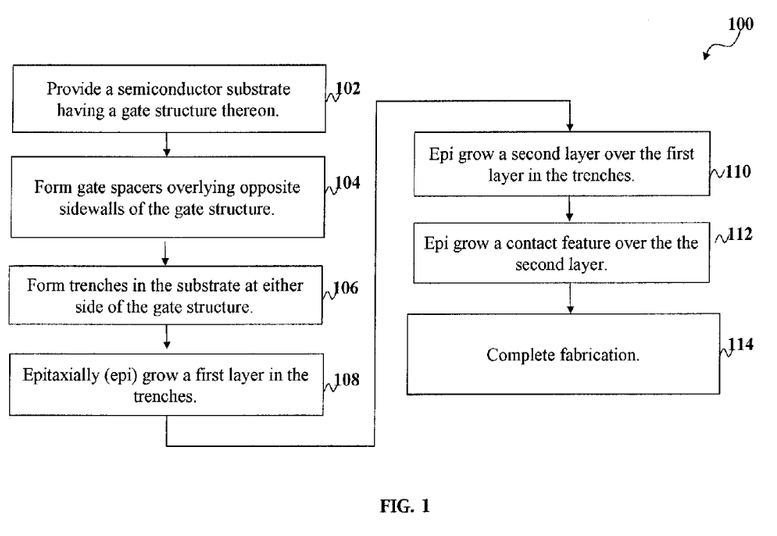
FIG. 1 is a flow chart of a method for fabricating an integrated circuit device according to an embodiment of the present disclosure.
Figure 2:
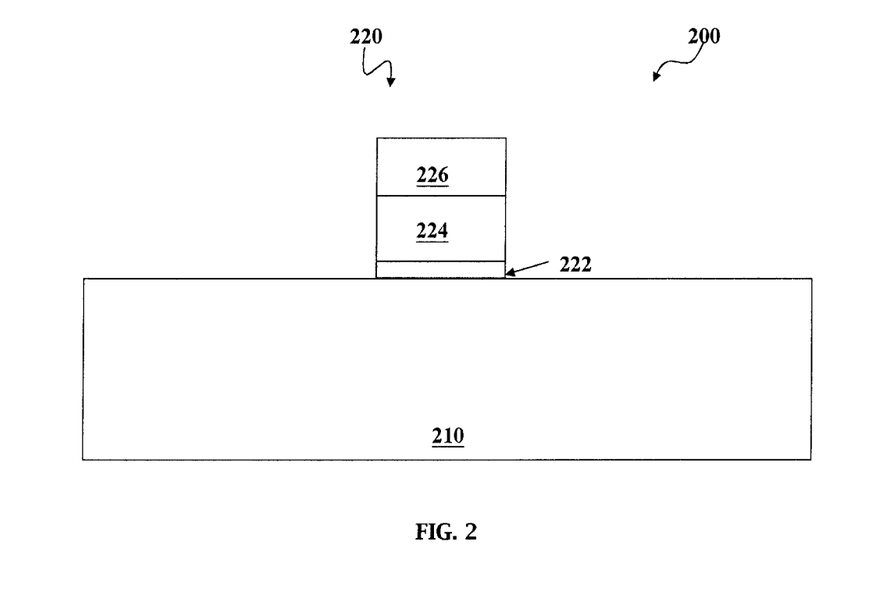
FIGS. 2-8 are various diagrammatic cross-sectional views of an example integrated circuit device at various fabrication stages according to the method of FIG. 1.

Referring to FIGS. 1 and 2, the method 100 begins at step 102, wherein a substrate 210 is provided. In the present embodiment, the substrate 210 is a semiconductor substrate comprising silicon. The silicon substrate, for example, is a so-called (001) substrate having a top surface parallel with a (001) lattice plane. In some alternative embodiments, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a PFET device and/or a NFET device, and thus, the substrate 210 may include various doped regions configured for the PFET device and/or the NFET device. A gate structure 220 for the PFET device and/or the NFET device is formed over the substrate 210. The gate structure 220, for example, is formed on the substrate 210 in the <110> direction when the substrate 210 is a so-called (001) substrate. In some embodiments, the gate structure 220 includes, in order, a gate dielectric 222, a gate electrode 224, and a hard mask 226. The gate structure 220 may be formed by deposition, lithography patterning, and/or etching processes as known in the art.

The gate dielectric 222 is formed over the substrate 210 and includes a dielectric material, such as silicon oxide, silicon oxynitride, silicon nitride, a high dielectric constant (high-k) dielectric material, other suitable dielectric material, or combinations thereof. Exemplary high-k dielectric materials include $HfO_2$, HfSiO, HfSiON, HfTaO, HfSiO, HfZrO, other suitable materials, or combinations thereof. In some embodiments, the gate dielectric 222 may be a multilayer structure, for example, including an interfacial layer, and a high-k dielectric material layer formed on the interfacial layer. An exemplary interfacial layer may be a grown silicon oxide layer formed by a thermal process or atomic layer deposition (ALD) process.

The gate electrode 224 is formed over the gate dielectric 222. In some embodiments, the gate electrode 224 is formed by a polycrystalline silicon (polysilicon) layer. The polysilicon layer may be doped for proper conductivity. In some alternative embodiments, the polysilicon is not necessarily doped if a dummy gate is to be formed and replaced in a subsequent gate replacement process. In yet some alternative embodiments, the gate electrode 224 could include a conductive layer having a proper work function. Therefore, the gate electrode 224 can also be referred to as a work function layer. The work function layer may comprise any suitable material, such that the layer can be tuned to have a proper work function for enhanced performance of the associated device. For example, in some embodiments, a p-type work function metal (p-metal) for the PFET device comprises TiN or TaN. On the other hand, in some embodiments, an n-type work function metal (n-metal) for the NFET device comprises Ta, TiAl, TiAlN, or TaCN. The work function layer may include doped conducting oxide materials. The gate electrode 224 may include other conductive materials, such as aluminum, copper, tungsten, metal alloys, metal silicide, other suitable materials, or combinations thereof. For example, where the gate electrode 224 includes a work function layer, another conductive layer can be formed over the work function layer.

The hard mask 226 formed over the gate electrode 224 includes silicon oxide, silicon nitride, silicon oxynitride, silicon carbide, other suitable dielectric material, or combinations thereof. The hard mask 226 may have a multi-layer structure.

Figure 3:
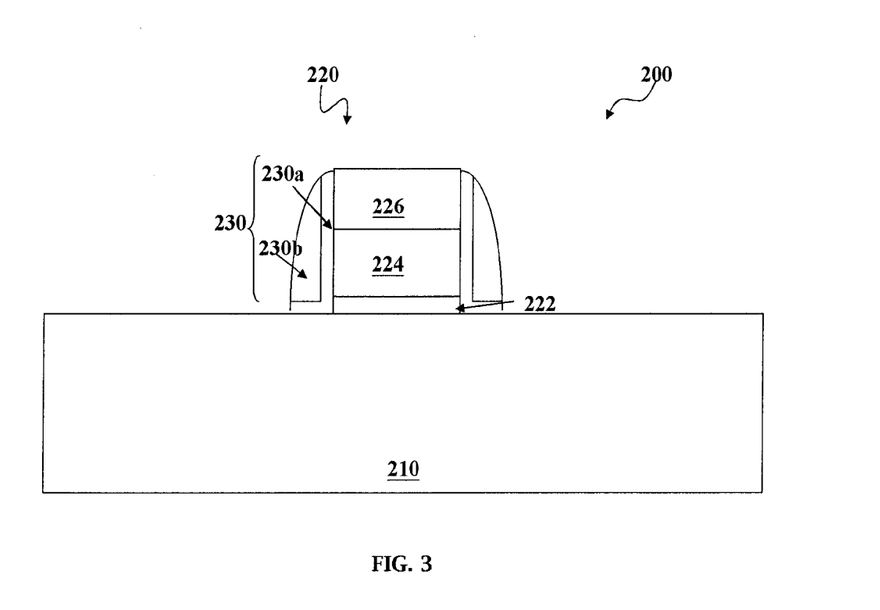

Referring to FIGS. 1 and 3, the method 100 continues with step 104 in which gate spacers 230 are formed overlying opposite sidewalls of the gate structure 220. In the depicted embodiment, a first spacer material (not shown) is deposited over the gate structure 220 and the substrate 210. The first spacer material may be formed by plasma-enhanced chemical vapor deposition (PECVD) and/or other suitable processes. In at least one embodiment, the first spacer material is a dielectric layer comprising silicon oxide. In at least one embodiment, the first spacer material has a thickness of less than approximately 150 Angstroms. Thereafter, a second spacer material (not shown) is deposited over the first spacer material. The second spacer material may be deposited using physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. In at least one embodiment, the second spacer material is a dielectric layer comprising silicon nitride. Other exemplary compositions for the second spacer material include silicon oxide, silicon carbide, silicon oxynitride, combinations thereof, and/or other suitable materials. In at least one embodiment, the second spacer material has a thickness less than approximately 200 Angstroms.

After the formation of the first and second spacer materials over the gate structure 220, a patterning process, e.g., blanket dry etching process, is performed on the first and second spacer materials to form gate spacers 230. The etching process may include an anisotropic etch to partially remove the first and second spacer materials from the substrate 210 in regions where epitaxy features or raised source/drain features will be formed. The gate spacers 230 may include first spacers (or may be referred to liners) 230a with L-shape and second spacers 230b with D-shape.

Figure 4:
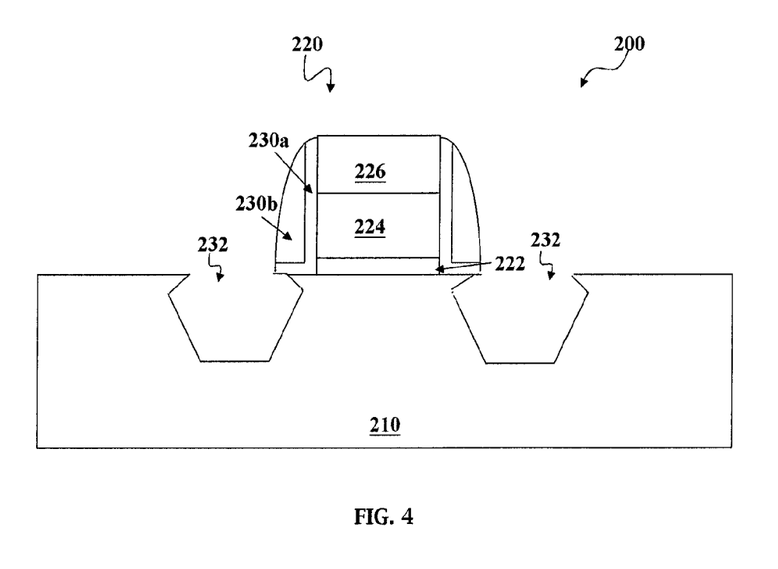

Referring to FIGS. 1 and 4, the method 100 continues with step 106 in which trenches 232 are formed in the substrate 210 at either side of the gate structure 220, particularly in the source and drain regions of the PFET device or the NFET device.

A capping layer (not shown) and a photoresist layer (not shown) may be formed over the semiconductor device 200 and then patterned to protect the other device region. The photoresist layer may further include an antireflective coating layer (not shown), such as a bottom antireflective coating (BARC) layer and/or a top antireflective coating (TARC) layer. An etching process then removes portions of the substrate 210 to form the trenches 232 in the substrate 210. The etching process includes a dry etching process, wet etching process, or combination thereof. In some embodiments, the etching process utilizes a combination of dry and wet etching processes. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mTorr to about 200 mTorr, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mTorr to about 200 mTorr, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mTorr to about 200 mTorr, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mTorr to about 200 mTorr, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, hydrofluoric acid (HF), tetramethylammonium hydroxide (TMAH), other suitable wet etching solutions, or combinations thereof. In an example, the wet etching process first uses a 100:1 concentration of an HF solution at room temperature, and then uses a $NH_4OH$ solution at a temperature of about 20° C. to about 60° C. In another example, the wet etching process first uses a 100:1 concentration of an HF solution at room temperature, and then implements a TMAH solution at a temperature of about 20° C. to about 60° C. After the etching process, a pre-cleaning process may be performed to clean the trenches 232 with a hydrofluoric acid (HF) solution or other suitable solution.

Figure 4A:
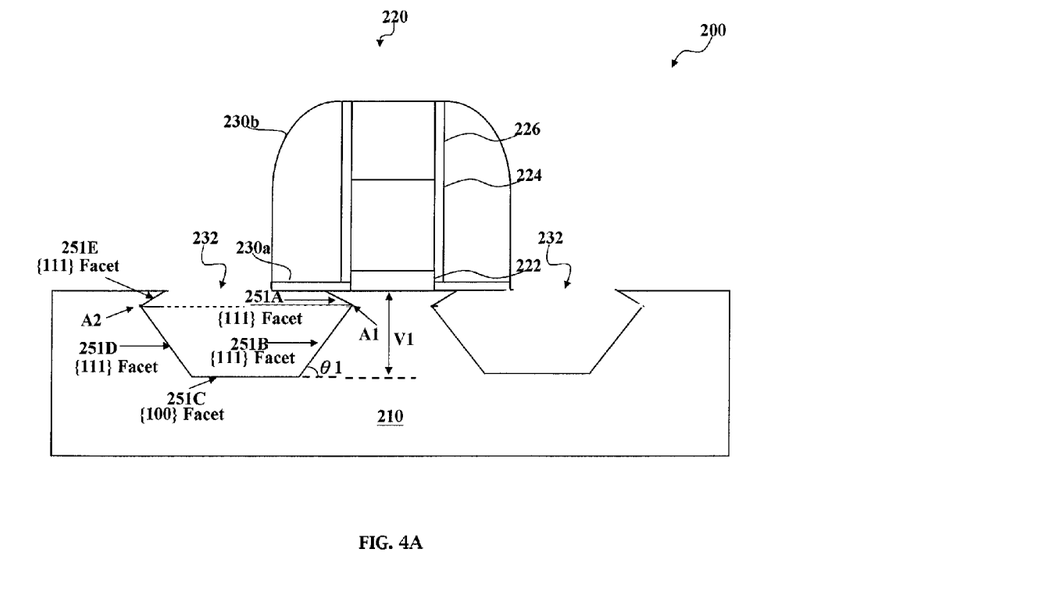

In FIG. 4A, the semiconductor device 200 is enlarged for better understanding of the etching profile of trenches 232. The etching profile of the trenches 232 defines source and drain regions of the NFET or PFET device, and the etching profile of the trenches 232 is defined by facets 251A, 251B, 251C, 251D, and 251E in the substrate 210. In some embodiments, the facets 251A, 251B, 251C, 251D, and 251E together define the trenches 232 with wedge-shaped. The facets 251A and 251E may be referred to as top sidewall facets, the facets 251B and 251D may be referred to as middle sidewall facets, and the facet 251C may be referred to as bottom facet. In the depicted embodiment, the facets 251A and 251E are formed of {111} crystallographic plane and slope to the principle surface of the substrate 210, the facets 251B and 251D are formed of {111} crystallographic plane and below the facets 251A and 251E, respectively. The facet 251C is formed of {100} crystallographic plane parallel to the principal surface of the substrate 210. In the depicted embodiment, the trenches 232 have a depth V1 ranging from about 300 Angstroms to about 700 Angstroms from the top surface of substrate 210 to facet 251C.

In the depicted embodiment, the etching profile of the trenches 232 defines a tip A1 by the intersection point of the facets 251A and 251B and a tip A2 by the intersection of the facets 251D and 251E. The tip A1, for example, is positioned under the gate spacer 230 toward the channel region underneath the gate structure 220. The etching profile of the trenches 232 defines a wedge-shaped bottom by the facets 251B, 251C, and 251D. In some embodiments, the facet 251B forms an angle $\theta 1$ to the principal surface of the substrate 210. The angle $\theta 1$, for example, is ranging from about 45 degrees to about 65 degrees with respect to the principle surface of substrate 210.

Figure 5:
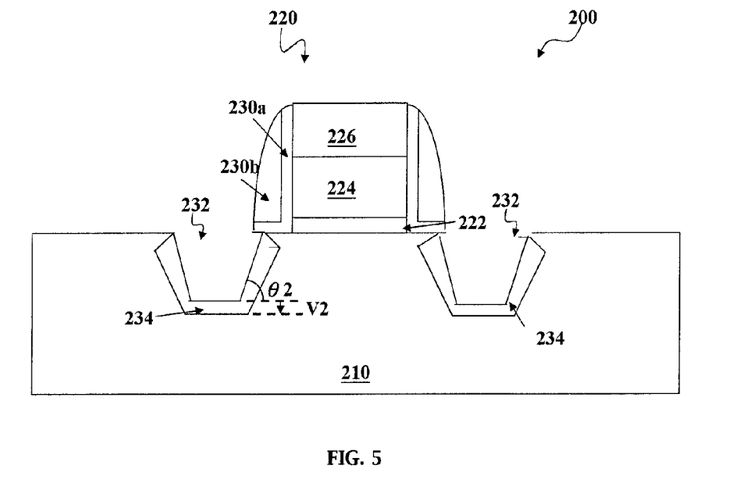

Referring to FIGS. 1 and 5, the method 100 continues with step 108 in which a first layer 234 is formed in the trenches 232. In some embodiments, the first layer 234 contacts the substrate 210 and with a wedge-shape by being formed along the bottom portion of the trenches 232. In some embodiments, a top surface of the bottom portion of the first layer 234 is substantially parallel to the principal surface of the substrate 210. In some embodiments, a sidewall surface of the first layer 234 near the facet 251B forms an angle $\theta 2$ with respect to the principal surface of the substrate 210. A ratio of the angle $\theta 2$ to the angle $\theta 1$, for example, is ranging from about 0.7 to about 1.5. The first layer 234 has a thickness V2. In at least one embodiment, the thickness V2 is ranging from about 50 Angstroms to about 250 Angstroms. In another embodiment, a ratio of the thickness V2 over the depth V1 of trenches 232 is ranging from about 0.25 to about 0.5. In the depicted embodiment, the first layer 234 is formed by an epitaxy or epitaxial (epi) process to partially fill the trenches 232. The epi process may include a selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epi processes, or combination thereof. The epi process may use gaseous and/or liquid precursors, which may interact with the composition of the substrate 210.

In some embodiments, the first layer 234 comprises a semiconductor material different from the substrate 210. In some embodiments, the first layer 234 comprises a semiconductor material with silicon and at least one additional element. In at least one embodiment, the first layer 234 comprises silicon, and germanium or tin for PFET devices. In another embodiment, the first layer 234 comprises silicon and carbon for NFET devices. In some embodiments, an atomic ratio (at %) of the at least one additional element in the first layer 234 is ranged within a limited amount to prevent significant defects formed in an interface between the first layer 234 and the substrate 210. In at least one embodiment, the at least one additional element is Ge and the first layer 234 is SiGe for a PFET device, and an atomic ratio of Ge in the first layer 234 is equal to or less than about 25 at %. The first layer 234 may function as a buffer layer between the substrate 210 and a subsequently formed main layer to prevent or reduce defects formed, therefore to reduce strain relaxation or current leakage.

In some embodiments, the first layer 234 is SiGe for a PFET device and deposited by an epi process using a Si-containing gas, e.g., silane, DCS; a Ge-containing gas, e.g., $GeH_4$, $GeCl_4$; a carrier gas, e.g., $H_2$; and/or a selective etching gas, e.g., HCl. In at least one embodiment, a mass flow ratio of the Ge-containing gas to the Si-containing for forming the first layer 234 is equal to or less than 0.025. In other embodiment, the epi process for forming the first layer 234 may be performed under a temperature ranging from about 500° C. to about 800° C., and under a pressure ranging from about 10 Torr to about 100 Torr.

In some embodiments, the first layer 234 is undoped. In some alternative embodiments, the first layer 234 can be doped. The doping process may be in-situ doped during formation of the first layer 234, with boron and/or $BF_2$ for PFET, or with phosphorous and/or arsenic for NFET. When the first layer 234 is undoped, it is understood that it may be doped in a subsequent process. The doping may be achieved by an ion implantation process, plasma immersion ion implantation (PIII) process, gas and/or solid source diffusion process, other suitable process, or combinations thereof. The first layer 234 may further be exposed to annealing processes, such as a rapid thermal annealing process. The boron dopant concentration in the first layer 234, for example, may be ranging from about 1E18 atoms/cm$^3$ to about 1E21 atoms/cm$^3$.

Referring to FIGS. 1, 6, 7A, and 7B, the method 100 continues with step 110 in which a second layer 236 is formed over the first layer 234 in the trenches 232 and fill the trenches 232. The second layer 236 may function as a main layer or a strain layer to strain or stress the channel region of device 200 and enhance carrier mobility of the device 200 to improve device performance.

Figure 6:
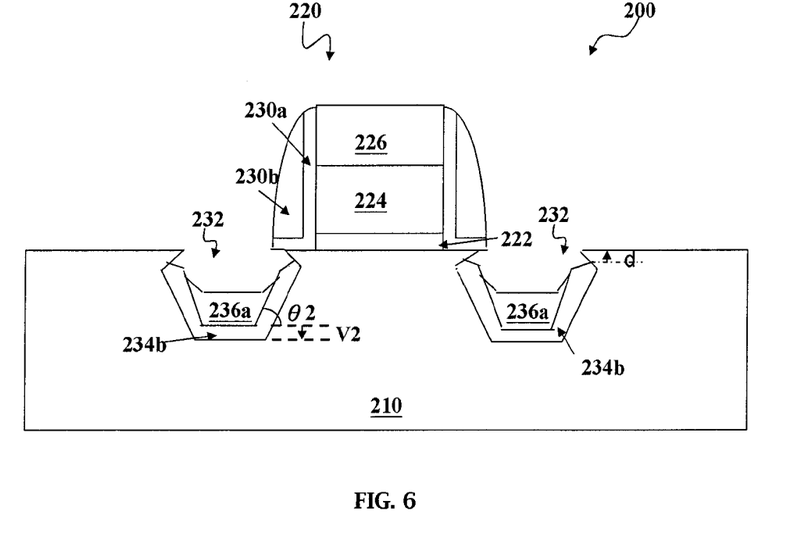
Figure 7A:
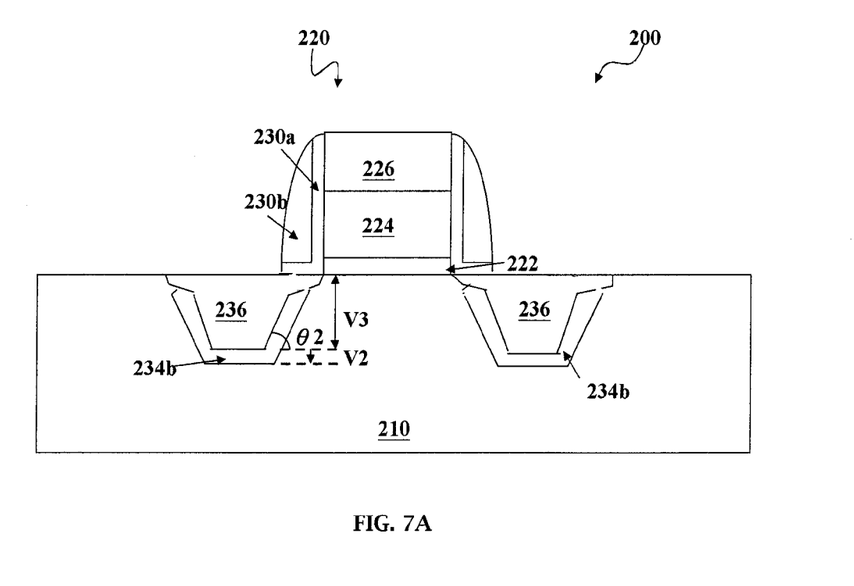
Figure 7B:
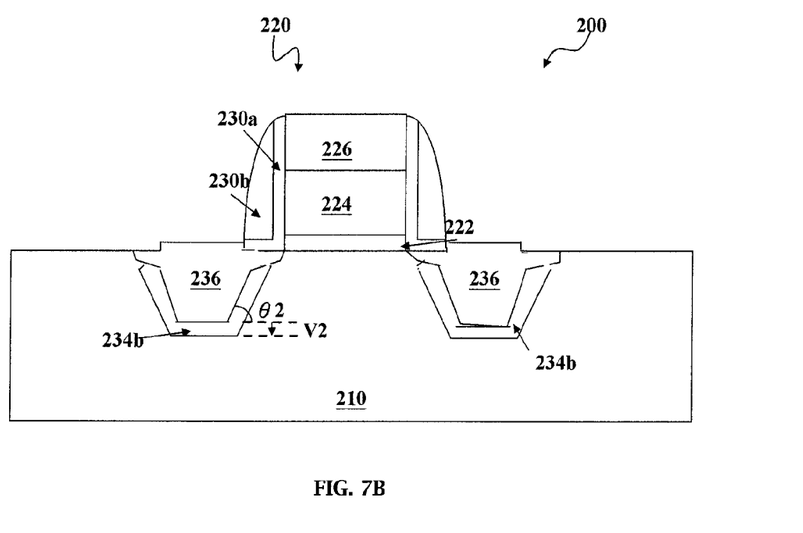

In some embodiments, the second layer 236 comprises silicon and at least one additional element. In at least one embodiment, the second layer 236 comprises silicon, and germanium or tin, which may form strained source/drain features for PFET devices. In another embodiment, the second layer 236 comprises silicon and carbon, which may form strained source/drain features for NFET devices. In at least one embodiment, the second layer 236 comprises silicon and at least one additional element same as the at least one additional element in the first layer 234. In other embodiment, the second layer 236 comprises silicon and at least one additional element with an atomic ratio (at %) greater than the atomic ratio (at %) of the additional element in the first layer 234, therefore, to provide sufficient stress/strain to the semiconductor device 200. In at least one embodiment, the at least one additional element is Ge and the second layer 236 is SiGe for a PFET device. In another embodiment, the atomic ratio of Ge in the second layer 236 is equal to or greater than about 35 at % to function as a strainer to enhance carrier mobility and improve device performance.

In at least one embodiment, the second layer 236 is deposited by an epi process using a Si-containing gas, e.g., silane, dichlorosilane (DCS); a Ge-containing gas, e.g., $GeH_4$, $GeCl_4$; a carrier gas, e.g., $H_2$; and/or a selective etching gas, e.g., HCl. In another embodiment, a mass flow ratio of the Ge-containing gas to the Si-containing gas for forming the second layer 236 is greater than the mass flow ratio of the Ge-containing gas to the Si-containing gas for forming the first layer 234. For example, a mass flow ratio of the Ge-containing gas to the Si-containing gas for forming the second layer 236 may be equal to or higher than about 0.05. In some embodiments, the epi process may be performed under a temperature ranging from about 500° C. to about 800° C., and under a pressure ranging from about 10 Torr to about 100 Torr.

Referring to FIG. 6, an intermediate second layer 236a is formed over the first layer 234 performed by the epi growth process mentioned above. It is noted that top portions of the first layer 234 may be removed to expose portions of the substrate 210 during the formation of the intermediate second layer 236a. In some embodiments, the top portion of the first layer 234 is removed to a thickness d ranging from about 25 Angstroms to about 100 Angstroms, resulting in a layer 234b. Referring to FIGS. 7A and 7B, a final second layer 236 is formed to fill the trenches 232 by continuously performing the epi growth process. By using a high Ge flow rate in the epi growth process, for example, the Ge-containing gas to the Si-containing gas being equal to or higher than about 0.05, and omitting an ion implantation process for forming lightly doped source/drain (LDD) regions in the substrate 210, there is a high removing rate to the substrate 210 during the continuous epi growth process. In some embodiments, portions of the exposed substrate 210 are removed and leave a space under the gate spacers 230 for lightly doped source/drain (LDD) regions. The final second layer 236 is thereafter completely formed with a potion to fill the trenches 232 and another portion to fill the space under the gate spacers 230. Therefore, the portions of final second layer 236 under the gate spacers 230 may function as strained LDD features and the other portions of final second layer 236 filled in the trenches 232 may function as strained source/drain (S/D) features.

The final second layer 236 may be undoped or in-situ doped with boron and/or BF2 for PFET, or doped with phosphorous and/or arsenic for NFET during formation of the final second layer 236. For example, the boron dopant concentration in the final second layer 236 may be ranging from about 1E18 atoms/$cm^3$ to about 1E21 atoms/$cm^3$. When the final second layer 236 is undoped, it is understood that it may be doped in a subsequent process. The doping may be achieved by an ion implantation process, plasma immersion ion implantation (PIII) process, gas and/or solid source diffusion process, other suitable process, or combinations thereof. The final second layer 236 may further be exposed to annealing processes, such as a rapid thermal annealing process.

The final second layer 236 has a thickness V3. In at least one embodiment, a ratio of the thickness V3 over the thickness V2 is ranging from about 1 to about 4. In other embodiment, the thickness V3 is ranging from about 250 Angstroms to about 550 Angstroms. In at least one embodiment, the final second layer 236 has a top surface substantially co-planer with the top surface of the substrate 210 as shown in FIG. 7A. In another embodiment, the final second layer 236 has a top surface higher than the top surface of the substrate 210 as shown in FIG. 7B, and the difference between the top surface of the second layer 236 and the top surface of the substrate 210 is less than about 100 Angstroms.

Figure 8:
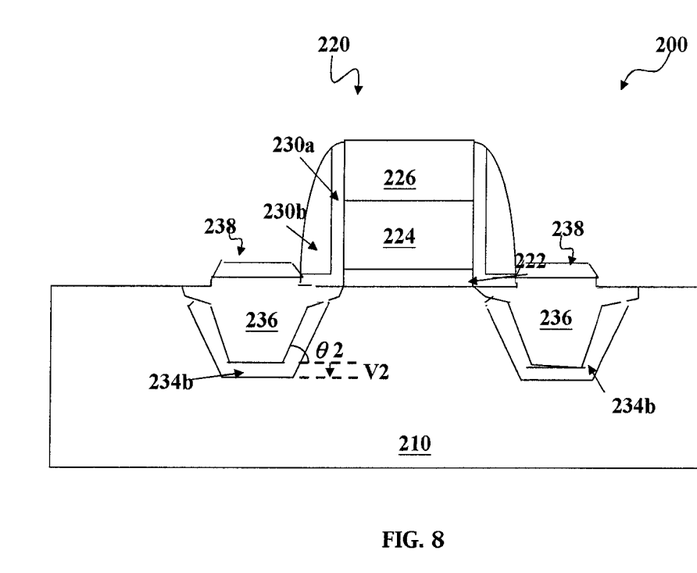

Referring to FIGS. 1 and 8, the method 100 continues with step 112 in which a contact feature 238 is selectively formed over the second layer 236 and contact the top surface of second layer 236. The contact feature 238 may provide a low contact resistance between the second layer 236 and a silicide layer formed subsequently. In at least one embodiment, the contact features 238 have a thickness ranging from about 80 Angstroms to about 200 Angstroms.

In some embodiments, the contact feature 238 comprises silicon and at least one additional element. In at least one embodiment, the contact feature 238 comprises silicon, and germanium or tin for PFET devices. In another embodiment, the contact feature 238 comprises silicon and carbon for NFET devices. In at least one embodiment, the contact feature 238 comprises silicon and at least one additional element same as the at least one additional element in the first layer 234. In some embodiments, an atomic ratio (at %) of the additional element in the contact feature 238 is less than the atomic ratio (at %) of the additional element in the second layer 236. In at least one embodiment, the additional element is Ge and the contact feature 238 is SiGe for a PFET device. In another embodiment, the atomic ratio of Ge in the contact feature 238 is less than about 20 at %. In some embodiments, the contact feature 238 is deposited by an epi process using the same chemicals as mentioned above. In some embodiments, a mass flow ratio of the Ge-containing gas to the Si-containing for forming the contact features 238 may be equal to or less than 0.01.

Further, the epi process may be performed under a temperature ranging from about 500° C. to about 800° C., and under a pressure ranging from about 10 Torr to about 100 Torr. The contact feature 238 may be undoped or in-situ doped with dopants the same as to the second layer 236. The contact feature 238 may have a dopant concentration ranging from about 1E18 atoms/$cm^3$ to about 1E21 atoms/$cm^3$. The contact feature 238 may further be exposed to annealing processes, such as a rapid thermal annealing process.

The semiconductor 200 is further processed to complete fabrication as discussed briefly below. For example, silicide features are formed on the contact features to reduce the contact resistance. The silicide features may be formed over the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the resulting structure to planarize the substrate with the ILD. Further, a contact etch stop layer (CESL) may be formed on top of the gate structure before forming the ILD layer. In at least one embodiment, the gate electrode remains to be polysilicon in the final device. In another embodiment, the polysilicon is removed and replaced with a metal in a gate last or gate replacement process. In a gate last process, the CMP process on the ILD layer is continued to expose the polysilicon gate electrode of the gate structures, and an etching process is performed to remove the polysilicon gate electrode, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate to electrically connect various features or structures of the semiconductor device. The multilayer interconnection includes vertical interconnects, such as vias or contacts, and horizontal interconnects, such as metal lines. The various interconnection features may utilize various conductive materials including copper, tungsten, and/or silicide. In one example, a damascene process is used to form copper multilayer interconnection structure.

In summary, the disclosed method provides a processing for forming an improved LDD features and source/drain features in the semiconductor device. Semiconductor device without performing an ion implantation process for forming LDD features can prevent the damage to the device, improve quality of epi layer and achieve high strain effect resulted from the epi layer, and therefore enhance the device performance. Further, LDD features formed by epi layer may provide additional channel strain to increase carrier mobility and further enhance the device performance. In addition, LDD features formed by epi layer may provide a precisely controlled depth of shallow junction with abrupt sidewalls. It has been observed that the disclosed methods and integrated circuit devices result in improved device performance, including but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising: a substrate; a gate structure over the substrate and defining a channel region in the substrate; and epitaxial (epi) strainers in the substrate, interposed by the channel region, wherein at least one of the epi strainers comprises: a lightly doped source/drain (LDD) feature, wherein the LDD feature is proximate to an edge of the gate structure; a source/drain (S/D) feature adjacent to the LDD portion; and a buffer layer under the epi strainers, wherein the LDD feature separates the gate structure from the buffer layer, wherein the buffer layer comprises silicon germanium (SiGe), wherein the epi strainers comprise silicon germanium (SiGe) with Ge equal to or greater than about 35 atomic ratio (at %).

2. The device of claim 1, wherein the epi strainers comprise a material different from the substrate.

3. The device of claim 1, wherein the epi strainers comprise a composition of silicon and an additional element, the additional element being germanium, tin, carbon, or combinations thereof.

4. The device of claim 1, wherein the substrate has a trench in which the at least one of the epi strainers is formed, the buffer layer lining a bottom surface and a sidewall surface of the trench, the buffer layer at least partially surrounding the S/D feature.

5. The device of claim 4, wherein the buffer layer comprises a composition of silicon and an additional element, the additional element being germanium, tin, carbon, or combinations thereof.

6. The device of claim 4, wherein the buffer layer comprises a thickness ranging from about 50 Angstroms to about 250 Angstroms.

7. The device of claim 4, wherein a ratio of a thickness of the epi strainers over a thickness of the buffer layer is ranging from about 1 to about 4.

8. The device of claim 1, further comprising:
a contact feature over the epi strainers.

9. The device of claim 8, wherein the contact feature comprises silicon germanium (SiGe) with Ge equal to or less than about 20 atomic ratio (at %).

10. A device, comprising: a substrate having trenches; a gate structure over the substrate and defining a channel region in the substrate; gate spacers overlying opposite sidewalls of the gate structure; lightly doped source/drain (LDD) features in the trenches of the substrate and interposed by the channel region; and source/drain (S/D) features in the trenches of the substrate, interposed by the channel region, and adjacent to the LDD features, wherein materials of the S/D features and the LDD features are the same and include dopant with the same doping concentration; a contact feature over the S/D features; and a buffer layer lining bottom surfaces and sidewall surfaces of the trenches, the buffer layer at least partially surrounding the S/D features, wherein the LDD features separate the buffer layer from the gate structure, wherein the buffer layer comprises silicon germanium (SiGe), wherein the buffer layer includes a same dopant as in the S/D features and the LDD features, and a doping concentration of a dopant in the buffer layer is lower than a doping concentration in the S/D features and a doping concentration in the LDD features.

11. The device of claim 10, wherein the dopant is boron and the doping concentration is ranging from about 1E18 atoms/$cm^3$ to about 1E21 atoms/$cm^3$.

12. The device of claim 10, wherein the S/D features and the contact feature comprise silicon germanium (SiGe) with different atomic ratios (at %) of Ge therein.

13. The device of claim 10, wherein the S/D features comprise silicon germanium (SiGe) with a lower atomic ratio (at %) of Ge in the buffer layer than in the S/D features.

14. The device of claim 10, wherein the buffer layer has a thickness ranging from about 50 Angstroms to about 250 Angstroms.

15. A device, comprising: a substrate having a trench and a channel region; a gate structure over the channel region; a spacer on a sidewall of the gate structure; a strainer filling the trench and extending toward the channel region along a bottom surface of the spacer; and a buffer layer lining a bottom surface and a sidewall surface of the trench, the buffer layer at least partially surrounding the strainer, wherein the strainer separates the buffer layer from the spacer; wherein the buffer layer comprises silicon germanium (SiGe), wherein the strainer comprises a composition of silicon and an additional element, and an atomic ratio of the additional element in the buffer layer is lower than in the strainer.

16. The device of claim 15, further comprising:
a contact feature over and in direct contact with the strainer, the contact feature comprising a composition of silicon and the additional element, and an atomic ratio of the additional element in the contact feature is lower than in the strainer.

17. The device of claim 1, wherein the LDD feature contacts the edge of the gate structure.

18. The device claim of 15, wherein the strainer filling comprises silicon germanium (SiGe) with Ge equal to or greater than about 35 atomic ratio (at %).

19. The device of claim 15, wherein the strainer filling comprise a composition of silicon and an additional element, wherein the additional element is germanium, tin, carbon, or combinations thereof.

20. The device of claim 16, wherein the contact feature has a dopant concentration ranging from about 1E18 atoms/cm$^3$ to about 1E21 atoms/cm$^3$.

* * * * *